(12) United States Patent
Chan et al.

(10) Patent No.: US 8,373,624 B2
(45) Date of Patent: Feb. 12, 2013

(54) ORGANIC LIGHT EMITTING DISPLAY (OLED) DEVISE, MODULES, AND ELECTRONIC DEVICES

(75) Inventors: Chuan-Yi Chan, Taipei (TW); Du Zen Peng, Jhubei (TW)

(73) Assignee: Chimei Innolux Corporation, Chu-Nan (TW)

( * ) Notice: Subject to any disclaimer, the term of this patent is extended or adjusted under 35 U.S.C. 154(b) by 1091 days.

(21) Appl. No.: 12/316,938

(22) Filed: Dec. 17, 2008

(65) Prior Publication Data
US 2009/0174630 A1  Jul. 9, 2009

(30) Foreign Application Priority Data

Jan. 4, 2008 (TW) ................................. 97100315 A

(51) Int. Cl.
*G09G 3/30* (2006.01)
(52) U.S. Cl. ...................................... 345/76; 315/169.3
(58) Field of Classification Search .............. 345/76–83, 345/204, 690; 315/169.3
See application file for complete search history.

(56) References Cited

U.S. PATENT DOCUMENTS

| | | | |
|---|---|---|---|
| 7,173,373 B2 | 2/2007 | Yamada et al. | |
| 7,554,518 B2 * | 6/2009 | Choi et al. | 345/98 |
| 7,686,666 B2 * | 3/2010 | Koo et al. | 445/24 |
| 2002/0118150 A1 * | 8/2002 | Kwon | 345/76 |
| 2004/0179157 A1 * | 9/2004 | Kim et al. | 349/114 |

* cited by examiner

*Primary Examiner* — Stephen Sherman
(74) *Attorney, Agent, or Firm* — Liu & Liu

(57) ABSTRACT

An organic light emitting display device is disclosed, which including an active matrix substrate with an array of active elements disposed in an active region and a control circuit disposed in a peripheral region. A color filter substrate is oppositely disposed to the active matrix substrate, including color filter elements with different colors enclosed by a black matrix layer in a region corresponding to the active region and an extension of the black matrix layer in a region corresponding to the peripheral region. An array of OLED pixel is interposed between the active matrix substrate and the color filter substrate on the active region. Each of the OLED pixels includes an anode, an organic electroluminescent layer, and a cathode. A first conductive component electrically connects the control circuit and the extension of the black matrix layer. A second conductive component electrically connects the black matrix layer and the cathode.

20 Claims, 20 Drawing Sheets

ORGANIC LIGHT EMITTING DISPLAY (OLED) DEVISE, MODULES, AND ELECTRONIC DEVICES

BACKGROUND OF THE INVENTION

1. Field of the Invention

The present invention relates to an organic light emitting display (OLED) device, and in particular relates to an active matrix organic light-emitting diode (AM-OLED) display device having a top cathode contact and image display system thereof.

2. Description of the Related Art

Flat display devices, such as organic light emitting display (OLED) and liquid crystal display (LCD), have many advantageous features, such as small dimensions, light weight, and low power consumption. Thus, flat display devices have been widely applied to electronic products, such as portable computers and mobile phones.

An organic light emitting display device having a self-emission feature adapts to applications for different environmental conditions, such as indoor applications and outdoor applications. Substantially, a conventional OLED device comprises an anode, an organic electroluminescent layer, and a cathode. A bias voltage may be applied between the anode and the cathode to activate the organic electroluminescent layer to emit light for image display. The technical trend of the OLED device is to improve light emitting efficiency and operating lifespan.

An active matrix organic light emitting display (AM-OLED) device comprises a matrix of active elements, such as an array of thin film transistors (TFT) and corresponding OLED pixels. An anode of each of the OLED pixels is controlled by the corresponding TFT. A cathode of the display device electrically connects to a control circuit in a peripheral region of the display device. A cathode of a conventional AM-OLED device forms an electrical connection from a lower substrate, such as an active matrix substrate, to other elements through a cathode contact. However, the contact area between the cathode and the cathode contact breaks easily due to bad step coverage of the cathode, which results in breakage or collapse of the cathode and further affects the quality and reliability of the device.

FIG. 1 shows a cross-section of a structure of a conventional AM-OLED device. Referring to FIG. 1, a conventional AM-OLED device 100 comprises a substrate 11 including an active region AR and a peripheral region PR. An array composed of a plurality of active elements 20 is disposed on the substrate 11 in the active region AR. The active element 20 may be, for example, a thin film transistor (TFT) comprising a gate 25, a gate dielectric layer 23, and a semiconductor layer 21 for forming a source/drain region and a channel region of the TFT. Passivation layers 12 and 13 are disposed on the substrate 11 to isolate each TFT and electrical connection. Signal lines 26A and 26B connect to the source region and the drain region of the TFT, respectively. The signal line 26B further connects to an anode 14 of each of the OLED pixels. An interlayer dielectric layer 13A is disposed on the passivation layer 13 to isolate each TFT and OLED pixel.

Pixel isolation structures 16 are disposed on the interlayer dielectric 13A to define and isolate each OLED pixel. Each OLED pixel comprises an anode 14 electrically connected to the signal line 26B through an electrical contact, organic electroluminescent layer 18 with different colors on the anode 14, and a continuative cathode 32 on the organic electroluminescent layer 18. A passivation layer 34 is disposed on the cathode 32.

Meanwhile, the continuative cathode 32 extends to the peripheral region PR of the substrate 11 and electrically connects to a signal line 28, such as a PVEE signal line, in a cathode contact opening. However, the step coverage of the cathode 32 near the step position 30 of the cathode contact opening is deficient, which results in breakage or collapse of the cathode and further affects the quality and reliability of the device.

In addition, U.S. Pat. No. 7,173,373 disclosed an AM-OLED device, wherein a plurality of cathode contacts are formed in the active element substrate to improve the electrical connection between the control circuit and the cathode. However, forming extra cathode contacts increases the complexity of the manufacturing process. For example, during patterning of the pixel electrodes and the contact holes, a more precise alignment system for photolithography is needed. Meanwhile, extra cathode contacts will also reduce the aperture ratio of the AM-OLED device.

Thus, it is desirable to have an AM-OLED display device and an image display system having a top cathode contact to prevent breakage or collapse near the contact position of the cathode.

BRIEF SUMMARY OF THE INVENTION

According to one illustrative embodiment, an organic light emitting display device is disclosed. The OLED device comprises an active matrix substrate with an array of active elements disposed in an active region and a control circuit disposed in a peripheral region. A color filter substrate is oppositely disposed to the active matrix substrate, comprising color filter elements with different colors enclosed by a black matrix layer in a region corresponding to the active region and an extension of the black matrix layer in a region corresponding to the peripheral region. An array of OLED pixels is interposed between the active matrix substrate and the color filter substrate on the active region. Each of the OLED pixels comprises an anode, an organic electroluminescent layer, and a cathode. A first conductive component electrically connects the control circuit and the extension of the black matrix layer. A second conductive component electrically connects the black matrix layer and the cathode.

According to a further illustrative embodiment, an OLED module is disclosed. The OLED module comprises an organic light emitting display device in accordance with an embodiment of the present invention and a controller coupled to the organic light emitting display device, which controls the organic light emitting display device to display an image according to an input signal.

According to yet a further illustrative embodiment, an electronic device is disclosed. The electronic device comprises an OLED module in accordance with an embodiment of the present invention and an input element coupled to the controller to send a signal to the controller for image display.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the embodiment of carrying out the invention. This description is made for the purpose of illustrating the general principles of the invention and should not be taken in a limiting sense. The scope of the invention is best determined by reference to the appended claims.

Figure 1:
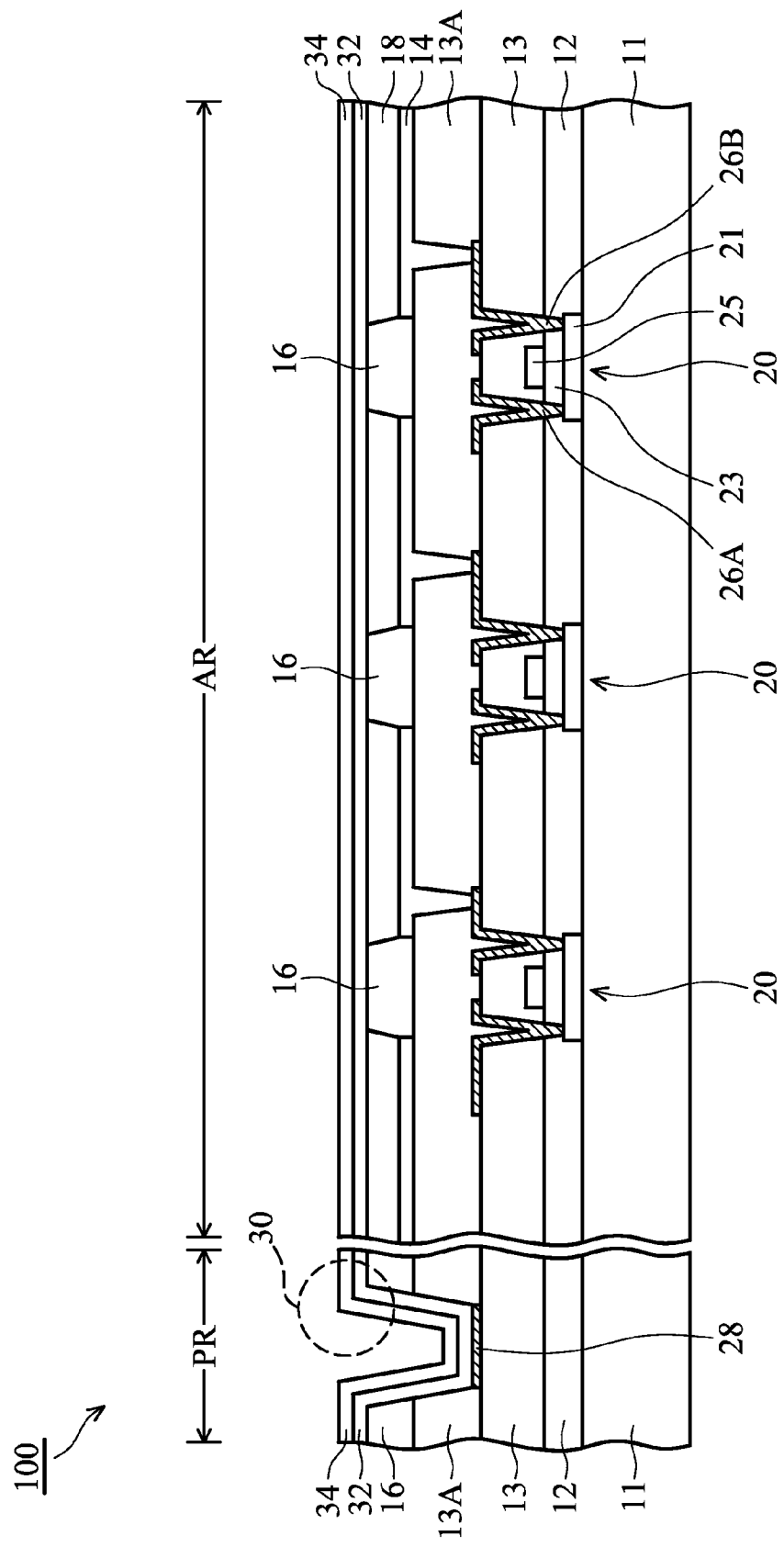
FIG. 1 shows a cross-section of a structure of a conventional AM-OLED device.
Figure 2:
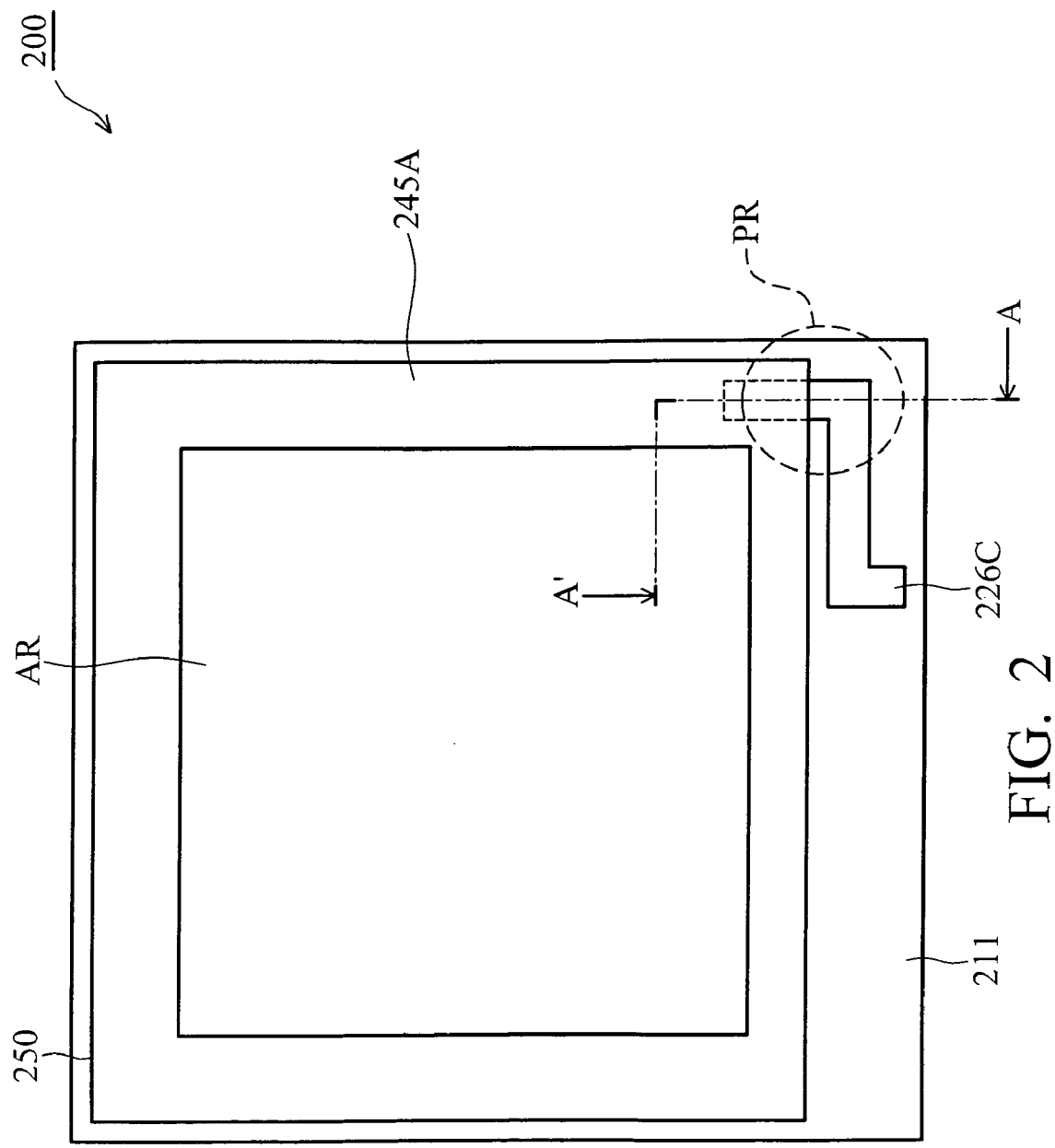
FIG. 2 is a top view showing an AM-OLED device in accordance with an embodiment of the present invention.
Figure 3:
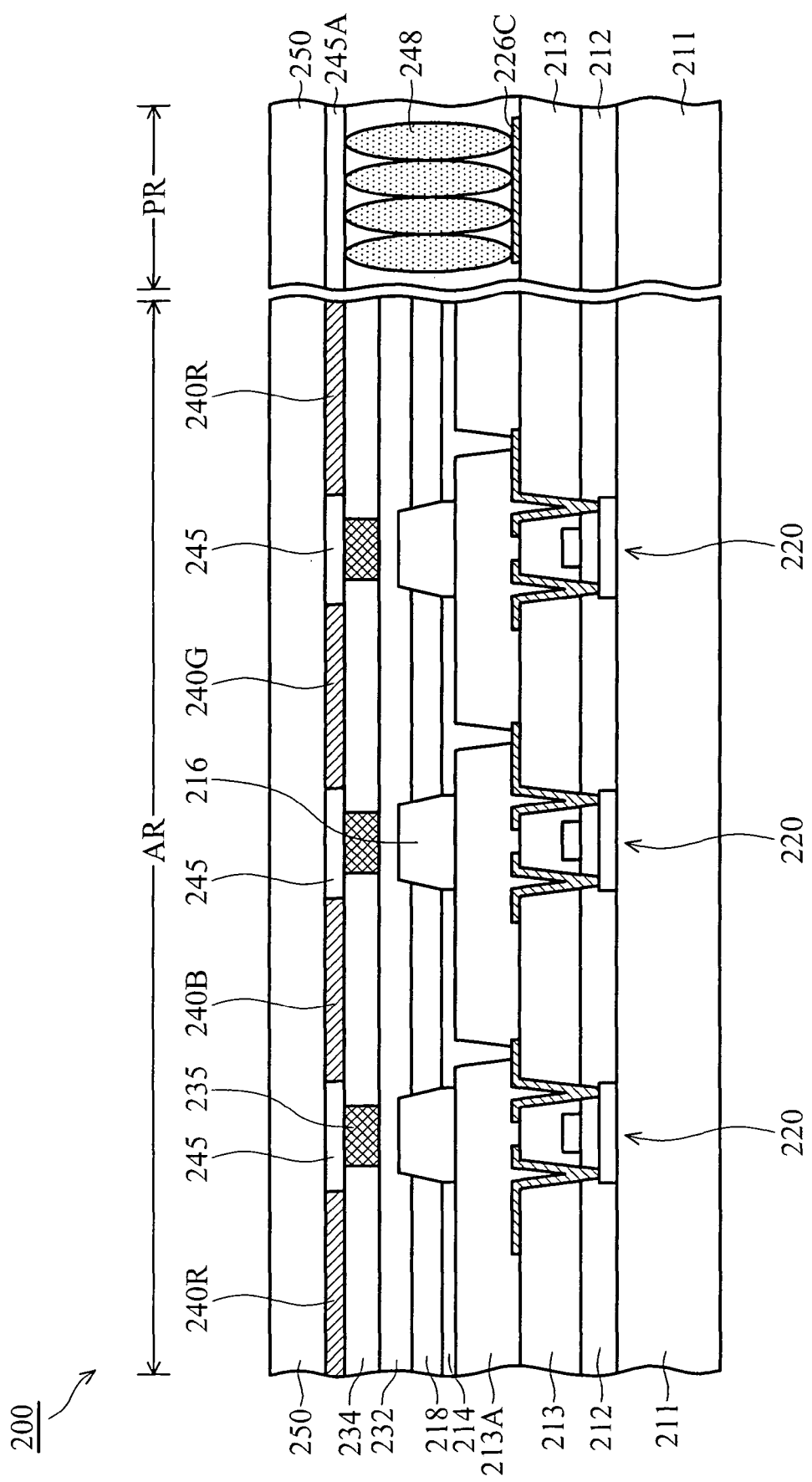
FIG. 3 is a cross-sectional view showing the AM-OLED device shown in FIG. 2 along the A-A' line.

FIG. 2 is a top view showing an AM-OLED device in accordance with an embodiment of the present invention. FIG. 3 is a cross-sectional view showing the AM-OLED device shown in FIG. 2 along the A-A' line. Referring to FIG. 2, in accordance with an embodiment of the present invention, an AM-OLED device 200, for example a top emission type active matrix organic light emitting display, comprises a lower substrate 211, such as an active matrix substrate, an upper substrate 250, such as a color filter substrate, and an array of OLED pixels interposed between the lower substrate 211 and the upper substrate 250. The lower substrate 211 comprises an active region AR and a peripheral region PR.

Referring to FIG. 3, the lower substrate 211 (active matrix substrate) comprises a plurality of active elements 220, such as an array of TFTs, disposed on the lower substrate 211. Passivation layers 212 and 213 are disposed on the lower substrate 211 to isolate each TFT and electrical connection of each layer. A signal line connecting a drain region of the TFT further connects to an anode 214 of each of the OELD pixels. An interlayer dielectric layer 213A is disposed on the passivation layer 213 to isolate each TFT and OLED pixel.

Pixel isolation structures 216 disposed on the interlayer dielectric layer 216A define and isolate each OLED pixel element. Each OLED pixel element comprises an anode 214 electrically connected to the signal line through a contact, organic electroluminescent layer 218 with different colors disposed on anode cathode 14, and a continuative cathode 232 on the organic electroluminescent layer 218. A passivation layer 234 is disposed on the cathode 232.

The upper substrate 250 (color filter substrate) comprises color filter elements 240R, 240G, and 240B corresponding to different colors, which are isolated by a black matrix (BM) layer 245. The black matrix layer 245 is a light absorption layer, for example a Cr layer, extending to a region corresponding to the peripheral region PR. The black matrix layer 245 extending to the region corresponding to the peripheral region PR is referred as BM extension 245A.

The upper substrate 250 (color filter substrate) is oppositely disposed to the lower substrate 211 (active matrix substrate), wherein each of the OLED pixels corresponds to each of the color filter elements 240R, 240G, and 240B. A signal line 226C, such as a PVEE signal line, is disposed on the passivation layer 213 in the peripheral region PR of the lower substrate 211. The signal line 226C electrically connects the BM extension 245A of the upper substrate 250 through a conductive component 248. The signal line 226C may be formed from the same metal layer of the aforementioned signal line connecting the source region of the TFT. It should be appreciated that the conductive component 248 is not limited to a single layer structure. The conductive component 248 may be a single layer, multiple layers, a composite layer, or combinations thereof. Moreover, the shape of the conductive component 248 may be elliptoid, rectangular, circular, square, or any other shape.

In the passivation layer 234 on the active region AR, another conductive component 235 is disposed in a position corresponding to the black matrix layer 245, which forms an electrical connection between the black matrix layer 245 and the cathode 232. Thus, a control signal from the PVEE signal line 226C may be sent to the cathode 232 through the conductive component 248, the BM extension 245A, and the conductive component 235. Accordingly, with comparison to the prior art, it is not necessary to form a cathode contact and a contact opening in the lower substrate 211 for the AM-OLED device 200 in accordance with an embodiment of the present invention. Thus, breakage or collapse of the cathode due to the bad step coverage of the cathode may be completely prevented and quality and reliability of the device is further improved.

Figure 4A:
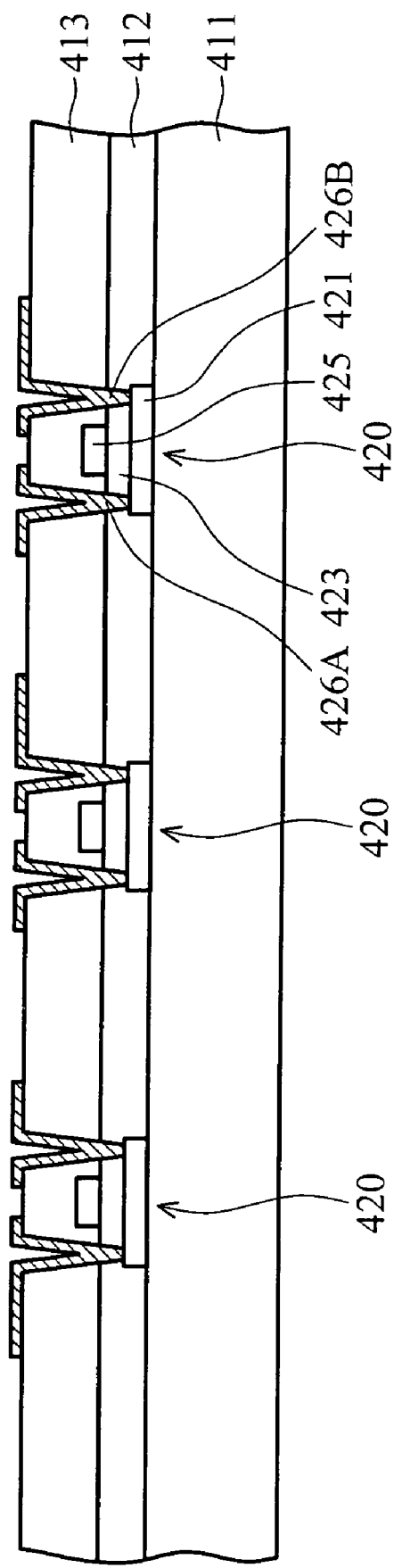
FIGS. 4A-4I show cross-sectional views of an AM-OLED device during various manufacturing stages in accordance with one embodiment of the present invention.
Figure 4B:
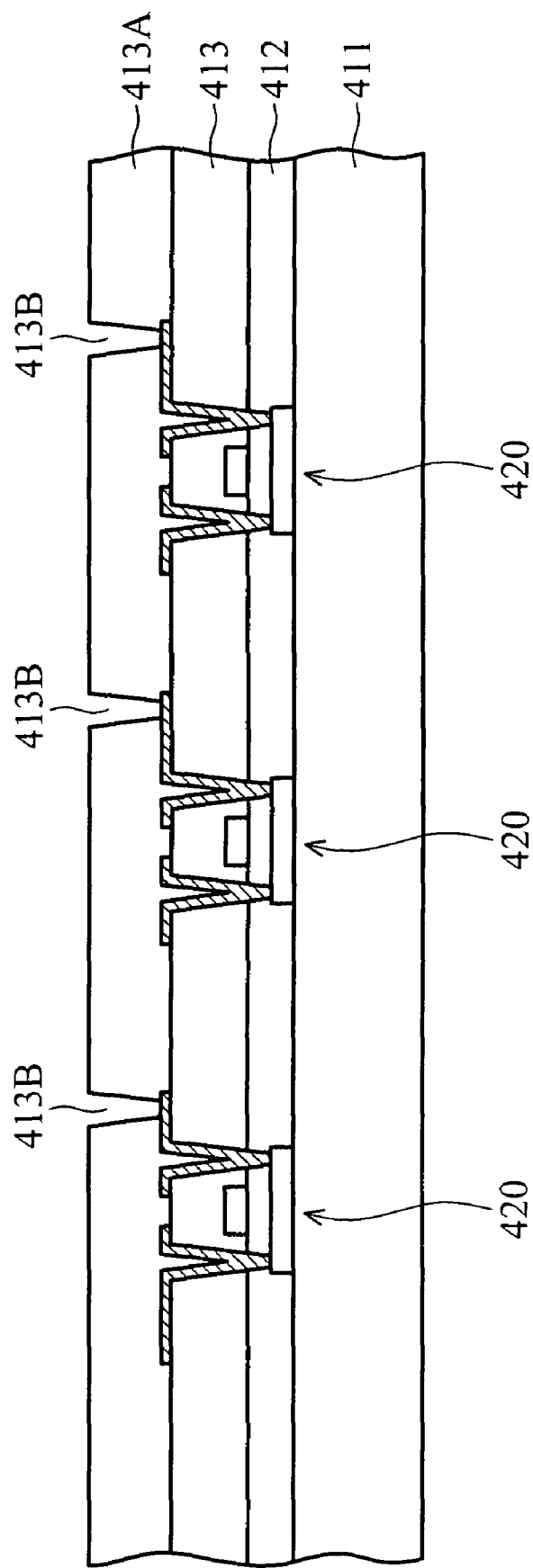
Figure 4C:
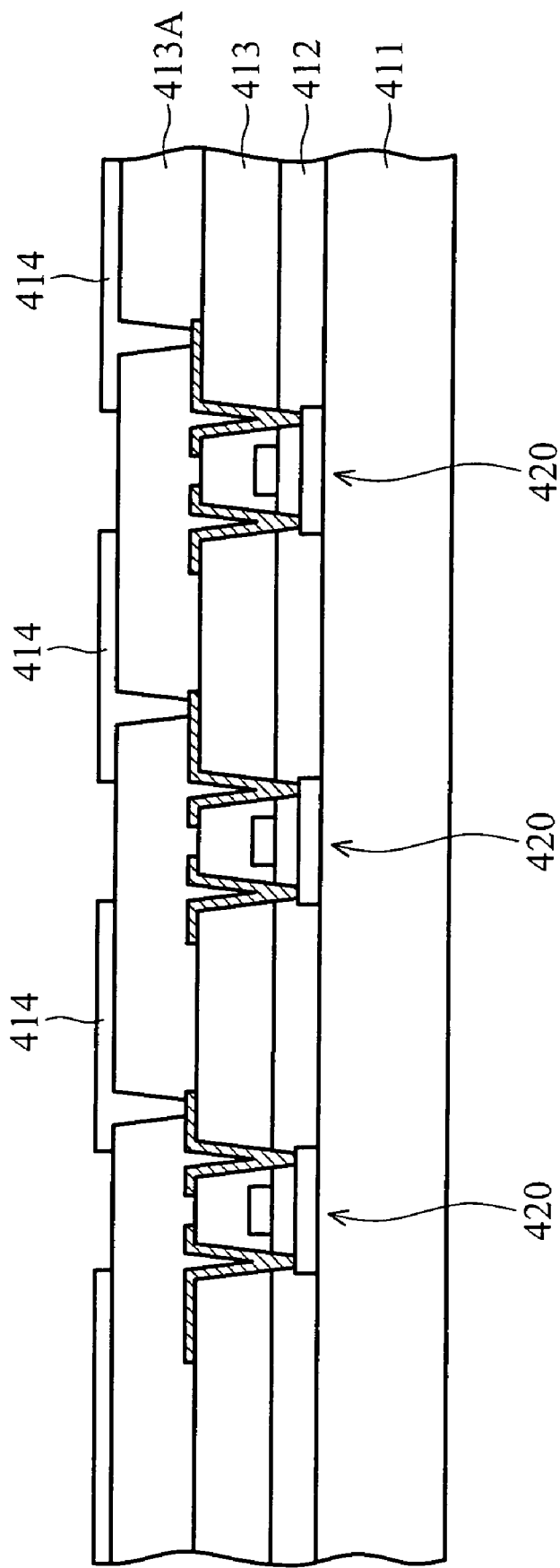
Figure 4D:
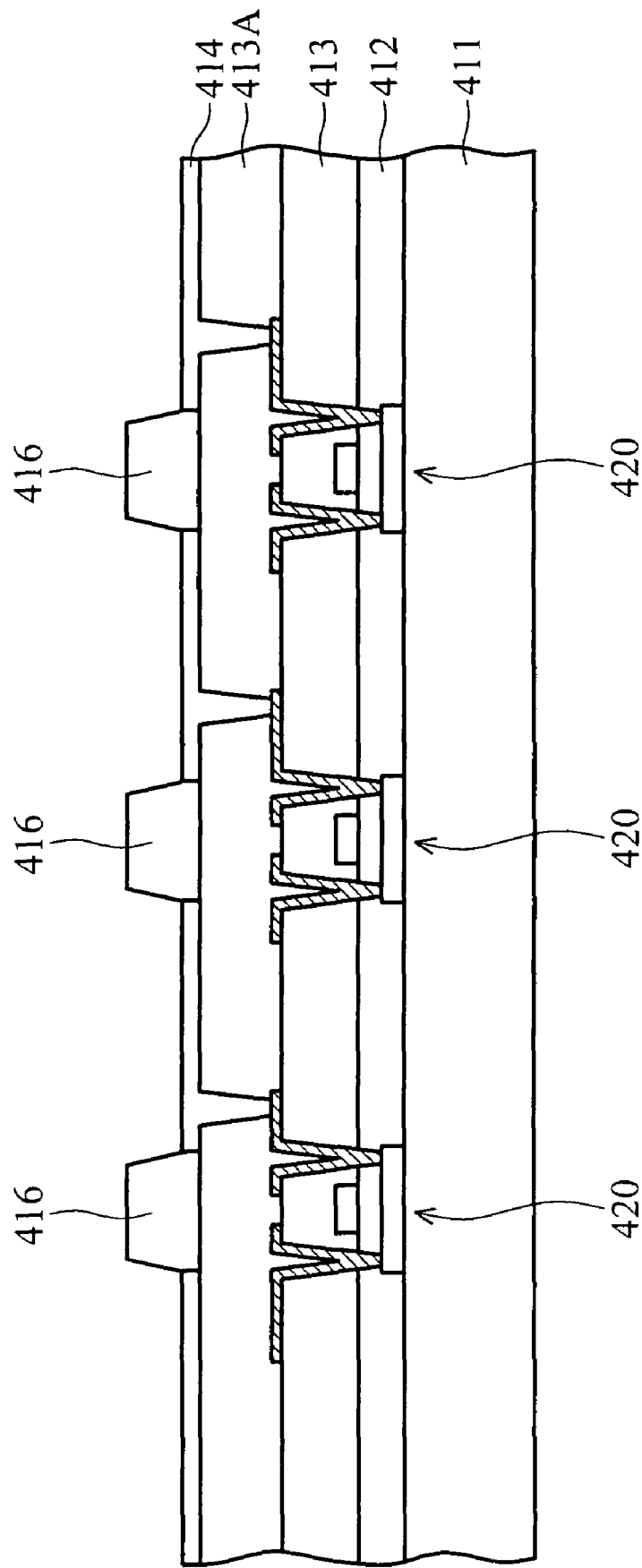
Figure 4E:
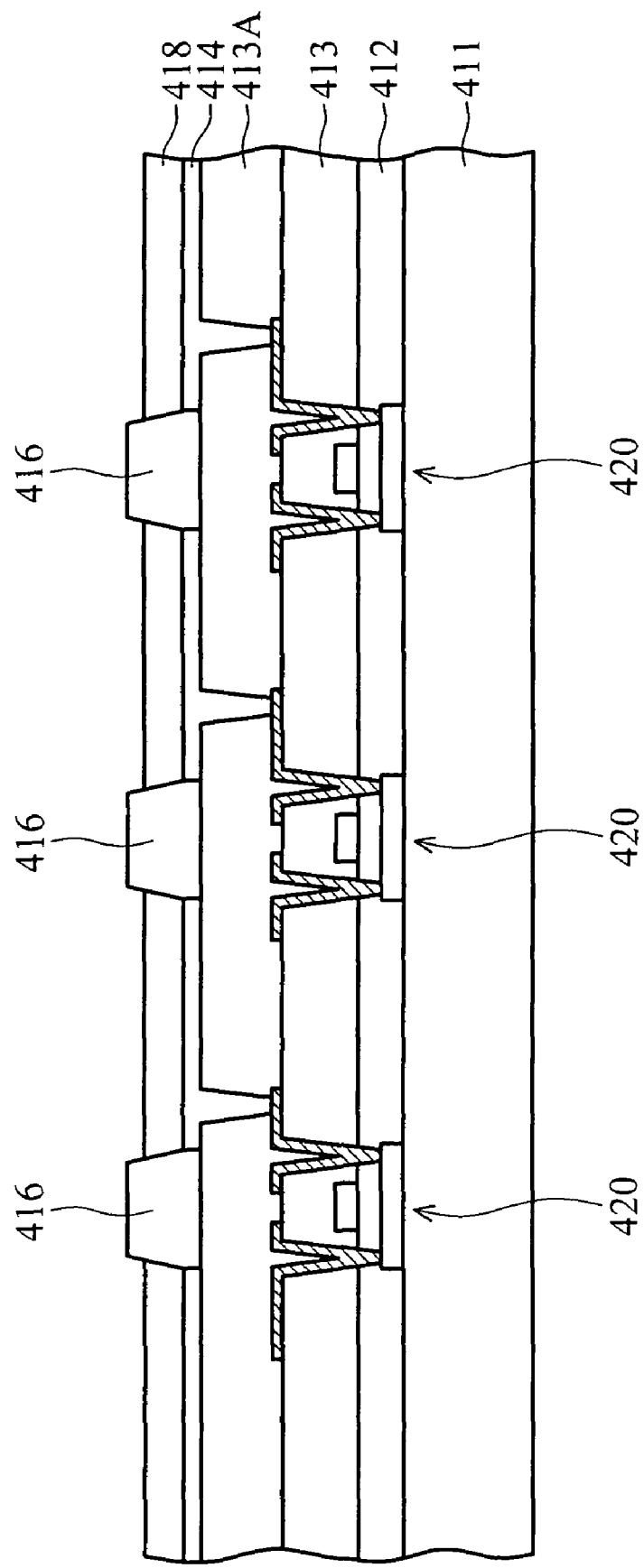
Figure 4F:
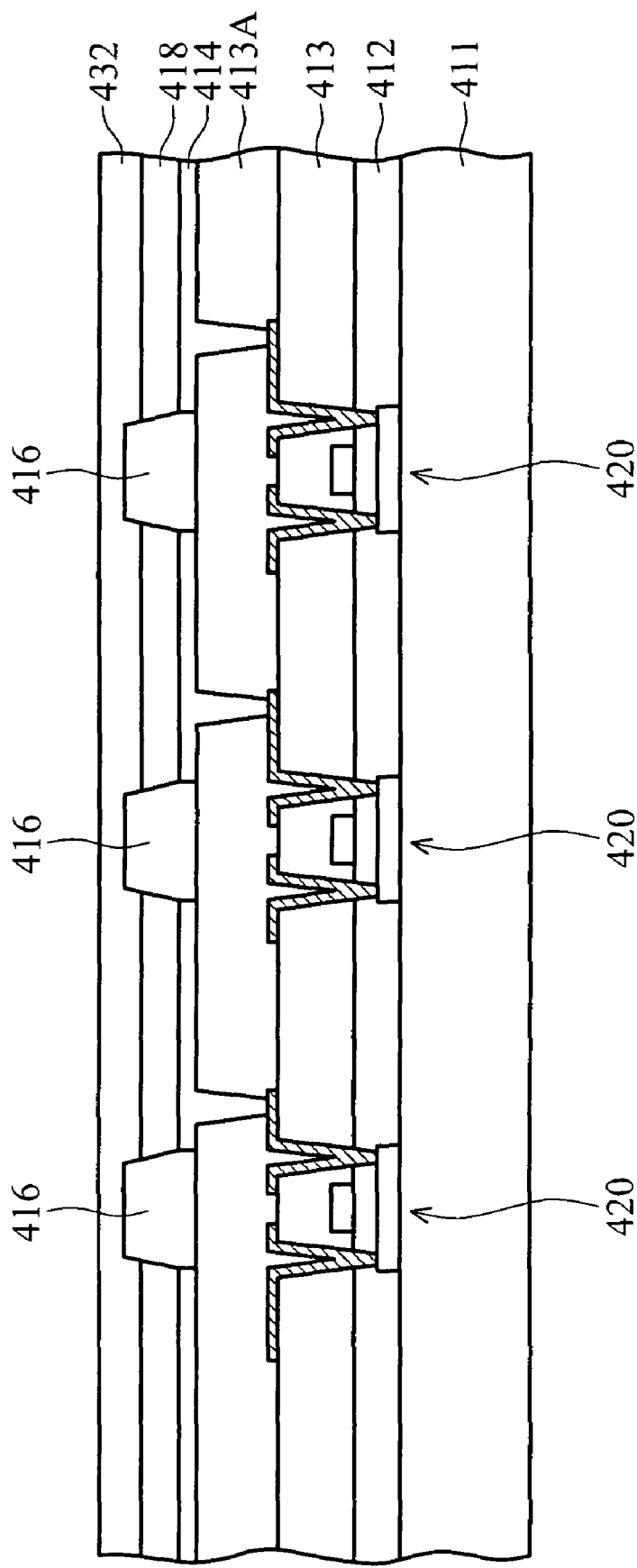
Figure 4G:
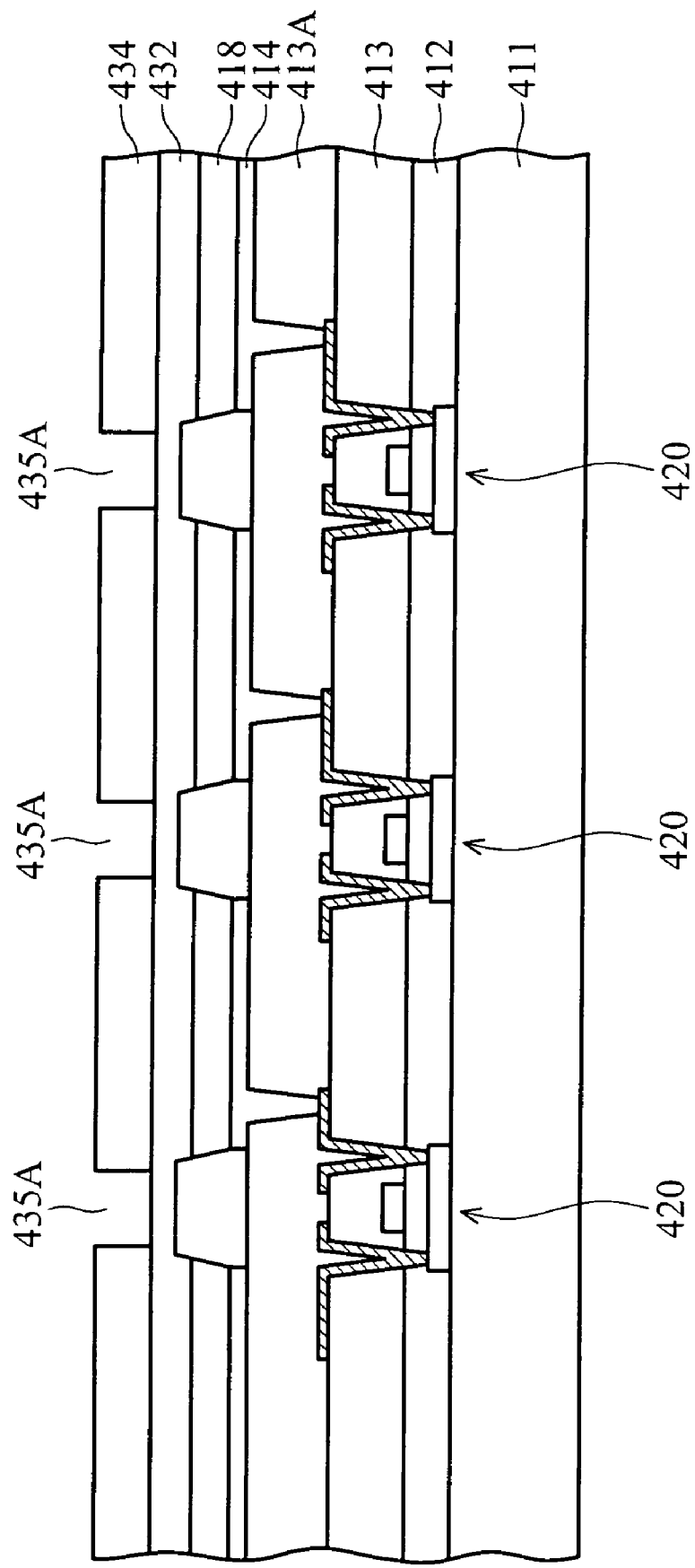
Figure 4H:
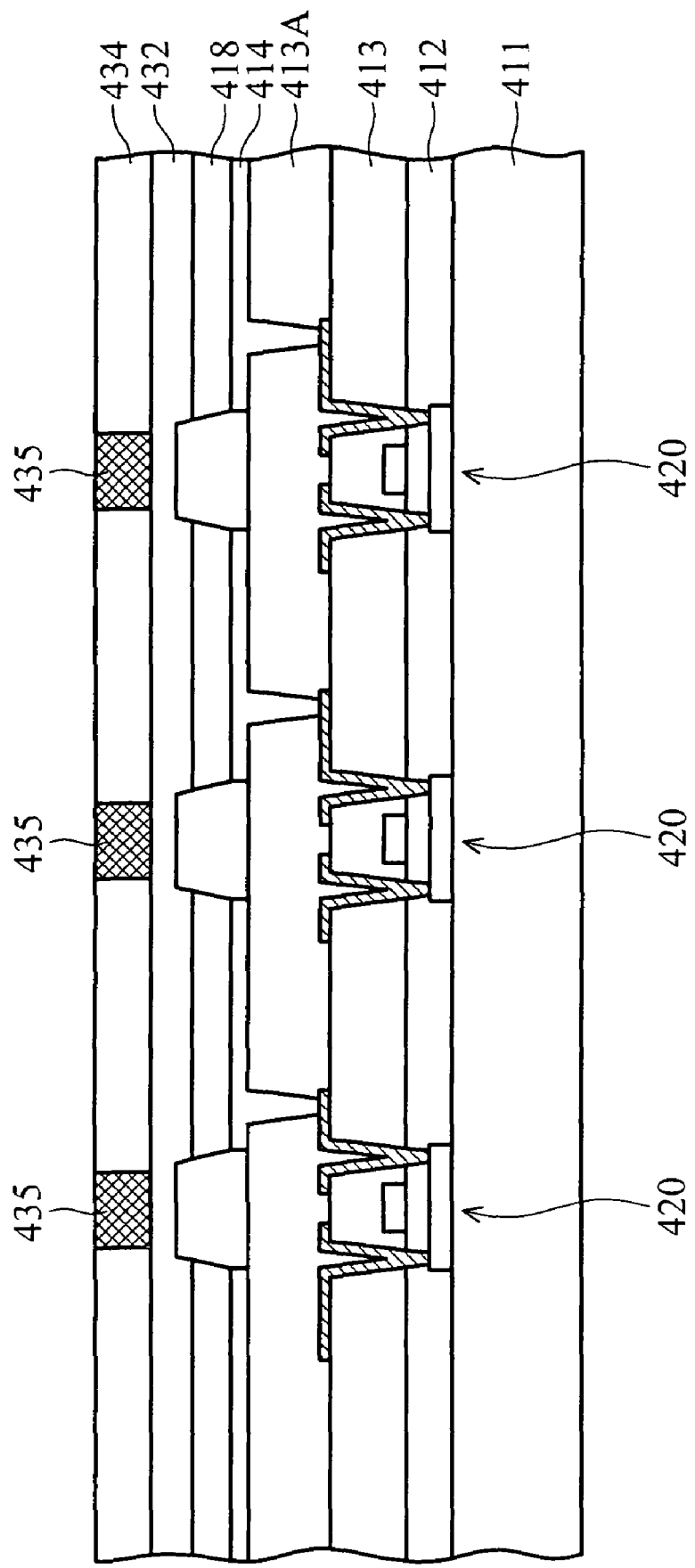
Figure 4I:
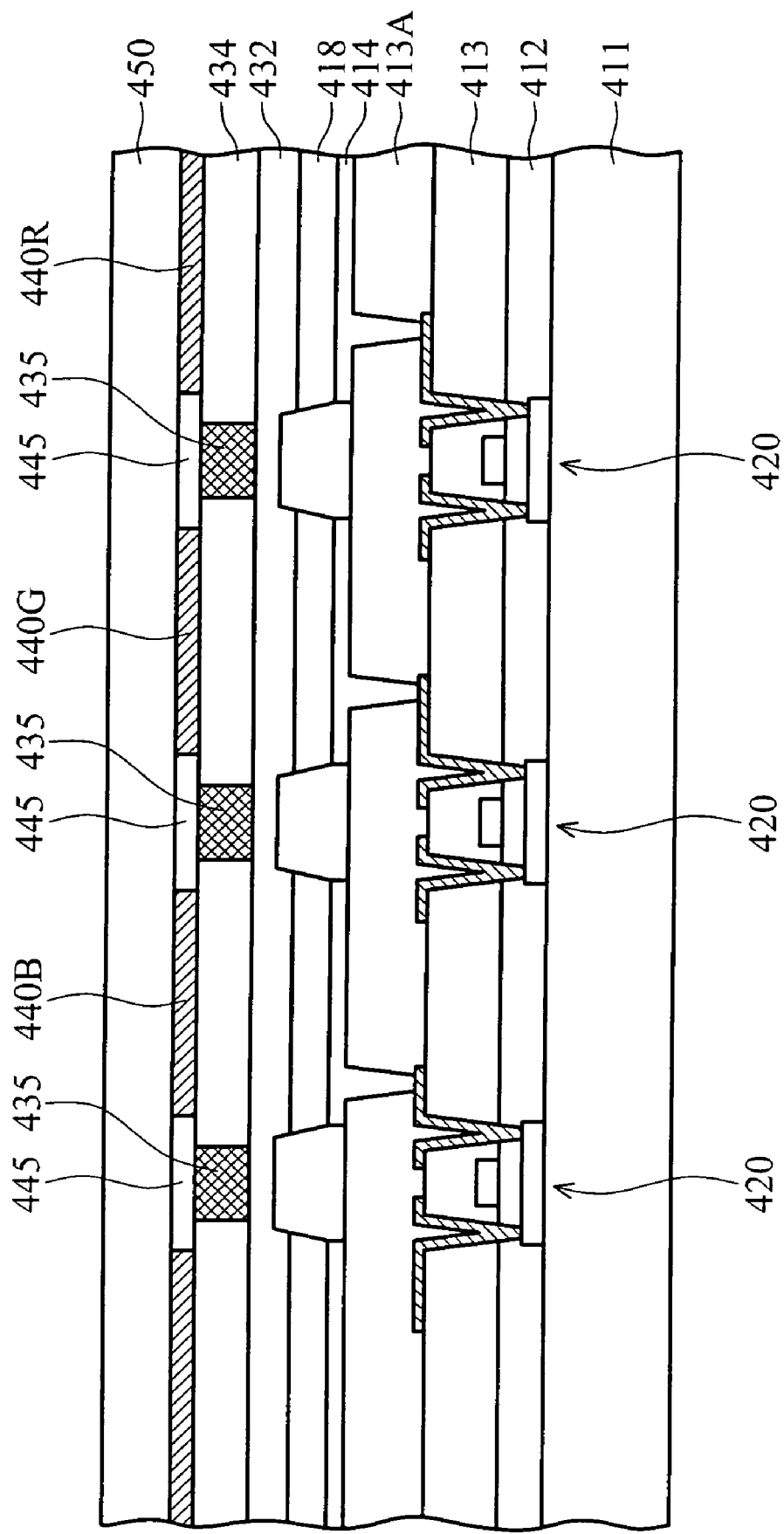

FIGS. 4A-4I show cross-sectional views of an AM-OELD device during various manufacturing stages in accordance with one embodiment of the present invention, wherein FIG. 4I shows the final structure corresponding to the active region AR shown in FIG. 3. First, referring to FIG. 4A, a substrate 411 is provided, and an array of active elements 420 is formed thereon. The substrate 411 comprises transparent glass, transparent polymer, quartz, or combinations thereof. Passivation layers 412 and 413 are disposed on the substrate 411 to isolate each active element 420 and other electrical connection layers. The array of the active elements 420 may be, for example, an array of thin film transistors (TFTs) each comprising a gate 425, a gate dielectric layer 423, and a semiconductor layer 421 for forming a source/drain region and a channel region of the TFT. The array of the active elements may comprise an array composed of thin film transistors and storage capacitors in another embodiment. Signal lines 426A and 426B, such as aluminum (Al) or aluminum (Al)-copper (Cu) alloy signal lines, are disposed on the passivation layer 413, which are connected to the source region and the drain region of the TFT, respectively. The signal line 426B further connects to an anode of each of the OLED pixels. Although a floating gate TFT is taken as an example to describe an embodiment of the present invention, the present invention is not limited to the example. On the contrary, other TFT devices, such as a buried gate TFT or a double gate TFT may also be used in the present invention.

Referring to FIG. 4B, an interlayer dielectric layer 413A is formed on the passivation layer 413 to isolate each TFT element and OLED pixel. Contact openings 413B are formed in the passivation layer 413 to expose the signal line 426B for forming an electrical connection to an anode 414 formed in a subsequent manufacturing process as shown in FIG. 4C. The interlayer dielectric layer 413A may be formed by a chemical vapor deposition (CVD) method or a spin coating method to have a substantially flat surface. The interlayer dielectric layer 413A may be made of an organic material, such as polyimide, or an inorganic material, such as silicon oxide, PSG, BSG, or combinations thereof.

Referring to FIGS. 4C and 4D, the anode 414 is patterned and pixel isolation structures 416 are formed on the interlayer dielectric layer 413A to define and isolate each OLED pixel. The anode 414 may also be used as a reflective layer to improve the light emitting efficiency of the OLED pixel. The anode 414 may be made of Pt, Au, Ag, Cr, W, or combinations thereof with a thickness ranging from about 100-300 nm. The pixel isolation structures 416 may be formed by applying a photolithography process to a thick photoresist material.

Referring to FIG. 4E, an organic electroluminescent layer 418 is formed on the anode 14. The organic electroluminescent layer 418 may be a light emitting layer of an OLED or a PLED. Moreover, the organic electroluminescent layer 418 may correspond to a pixel with different colors, such as red, green, blue, or white.

Referring to FIG. 4F, a continuative cathode 432 is formed on the substrate 411 (active matrix substrate) directly contacting the organic electroluminescent layer 418. The cathode 432 may be a single layer or a multiple layer structure made of Ag, Al, Mg, Ca, Na, indium oxide, tin oxide, Zinc oxide, ITO, IZO, or combinations thereof with a thickness ranging from about 10-200 nm.

Referring to FIG. 4G, a passivation layer 434 is then formed on the cathode 432. The passivation layer 434 is patterned to form a plurality of openings 435A corresponding to positions of the pixel isolation structures 416 and exposing a surface of the cathode 432. Then, conductive components 435 are formed in each opening 435A as shown in FIG. 4H. In accordance with an embodiment of the present invention, the passivation layer 434 may be a thick photoresist layer or a dielectric layer. The openings 435A are formed by a photolithography process and an etching process. Then, a metal layer is filled into the openings 435A. A planarization process is applied to the metal layer to leave the conductive components 435 in each opening 435A.

It should be appreciated that, although the passivation layer 434 and the openings 435A are formed before the forming of the conductive components 435, the present invention does not limit the formation. In other embodiment, the conductive components 435 may be formed before the forming of the passivation layer 434.

Referring to FIG. 4I, an upper substrate 450 (color filter substrate) is formed, which comprises color filter elements 440R, 440G, and 440B corresponding to different colors isolated by a black matrix layer 445. The black matrix layer 445 is a light absorption layer. The black matrix layer 445 may be a Cr layer extending to a region corresponding to the peripheral region PR.

Next, the upper substrate 450 (color filter substrate) and the lower substrate 411 (active matrix substrate) are oppositely combined to each other, wherein each OLED pixel corresponds to each of the color filter elements 440R, 440G, or 440B. Thus, an electrical connection is formed between the black matrix layer 445 and the conductive components 435.

Moreover, a signal line, such as a PVEE signal line, is disposed on the passivation layer 413 in the peripheral region PR of the lower substrate 411, which electrically connects to an extension of the black matrix layer 445 (or so-called BM extension). Thus, a control signal from the PVEE signal line may be sent to the cathode 432 through the conductive component in the peripheral region PR, the BM extension of the black matrix layer, the black matrix layer 445, and the conductive component 432.

Figure 4J:
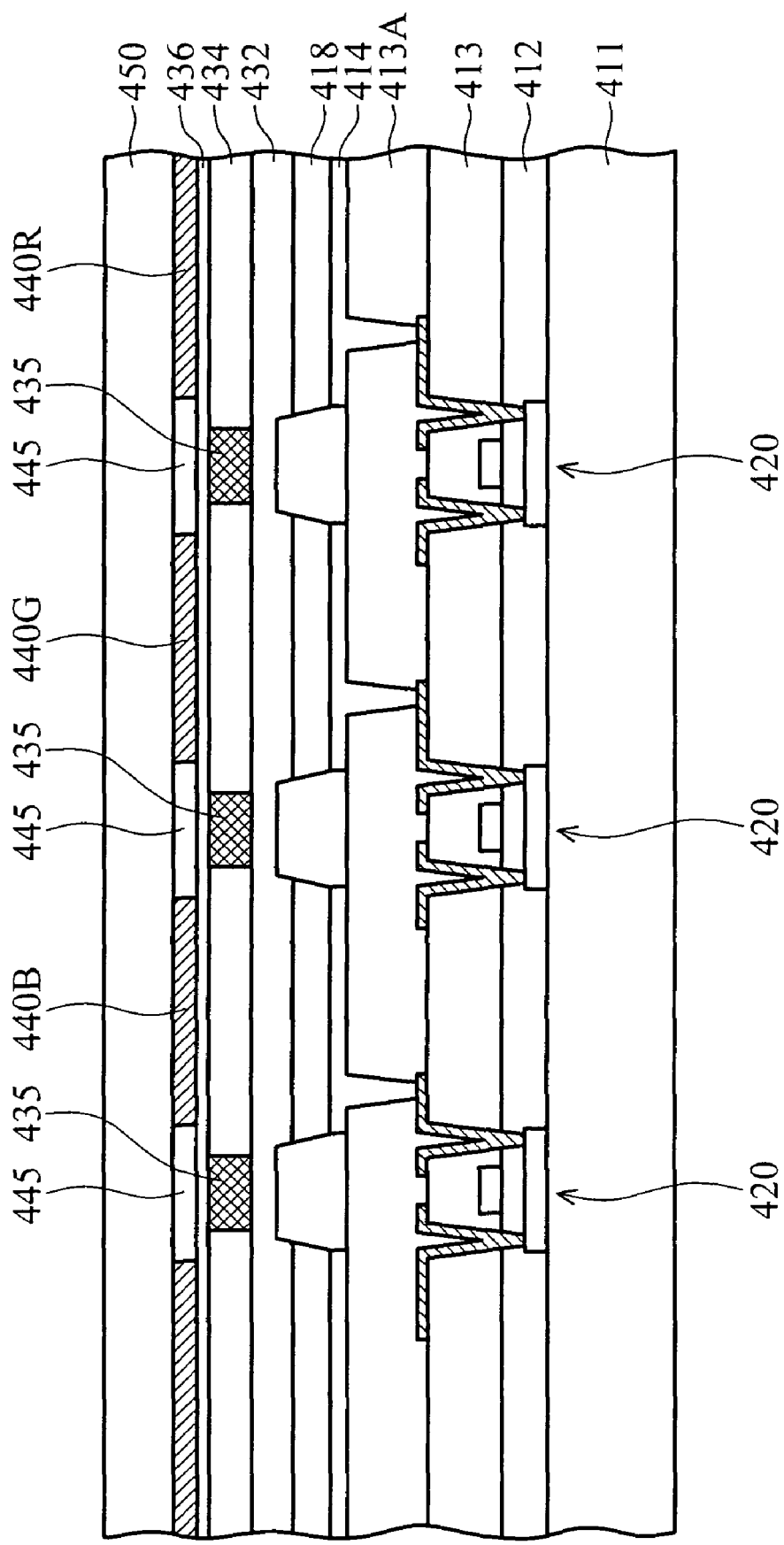
FIG. 4J shows a cross-sectional view of an AM-OLED device in accordance with a further embodiment of the present invention.

FIG. 4J shows a cross-sectional view of an AM-OLED device in accordance with a further embodiment of the present invention. After the upper substrate 450 (color filter substrate) and the lower substrate 411 (active matrix substrate) are oppositely combined to each other, an auxiliary conductive layer 436 (conductive component) is provided between the passivation layer 434 and the color filter elements 440R, 440G, and 440B in order to improve the electrical connection between the conductive component 435 and the black matrix layer 445 in accordance with another embodiment of the present invention. The auxiliary conductive layer 436 is made of transparent oxide conductive layer, such as an ITO layer or an IZO layer formed by a CVD method or a sputtering method.

Figure 5A:
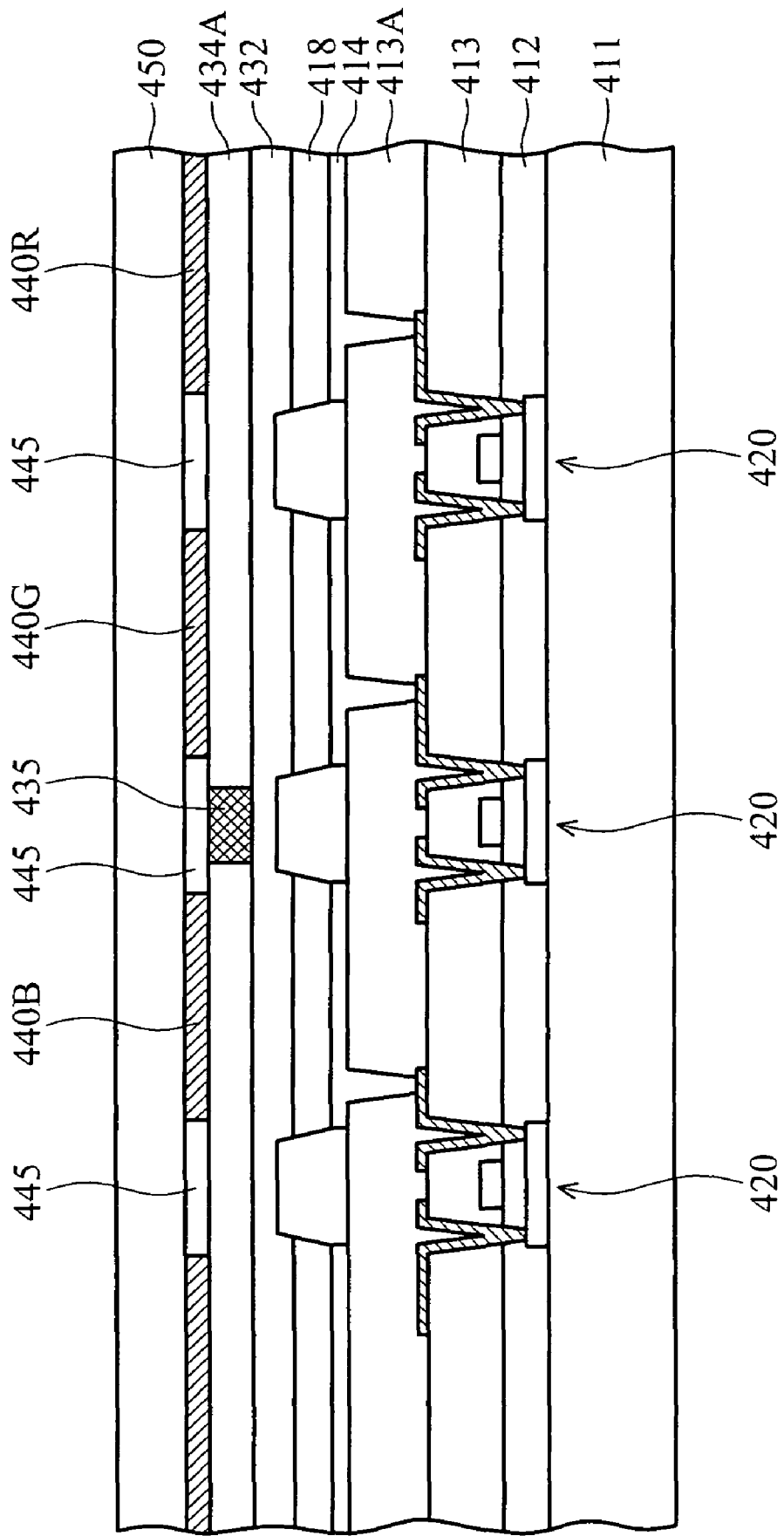
FIG. 5A shows a cross-sectional view of an active region of an AM-OLED device in accordance with yet a further embodiment of the present invention.
Figure 5B:
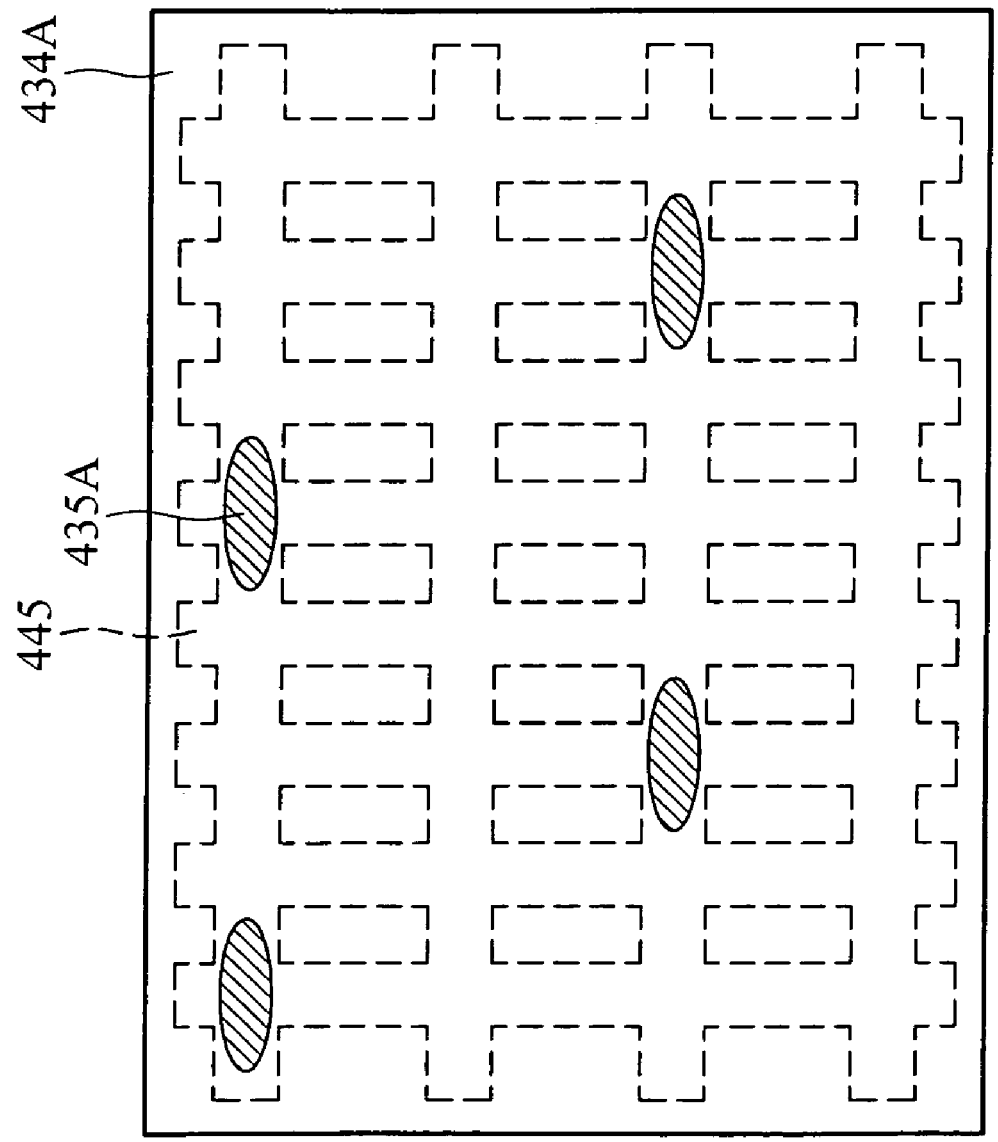
FIGS. 5B-5E show top views of some possible shapes of the openings to be filled with conductive material to form a conductive component of an AM-OLED device in accordance with one embodiment of the present invention.
Figure 5C:
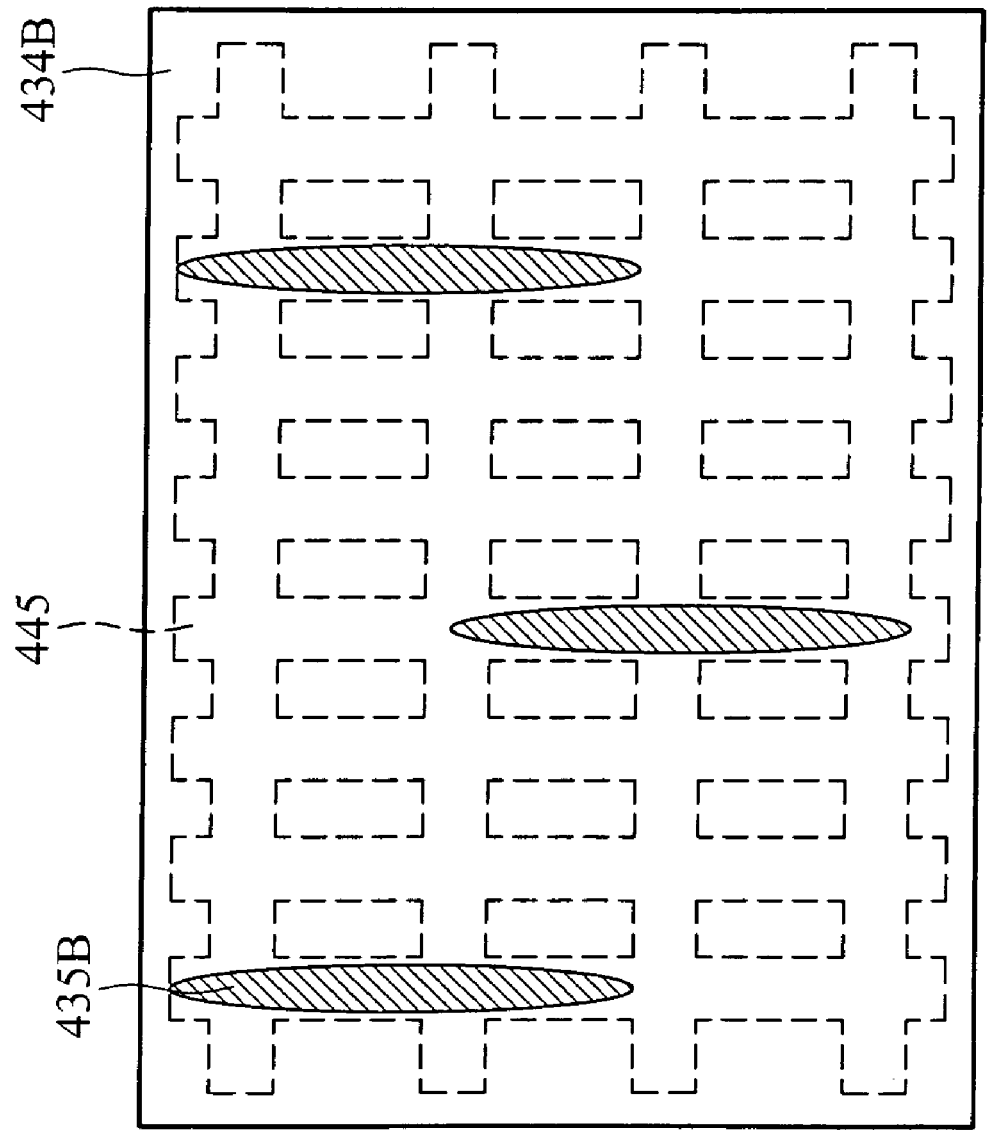
Figure 5D:
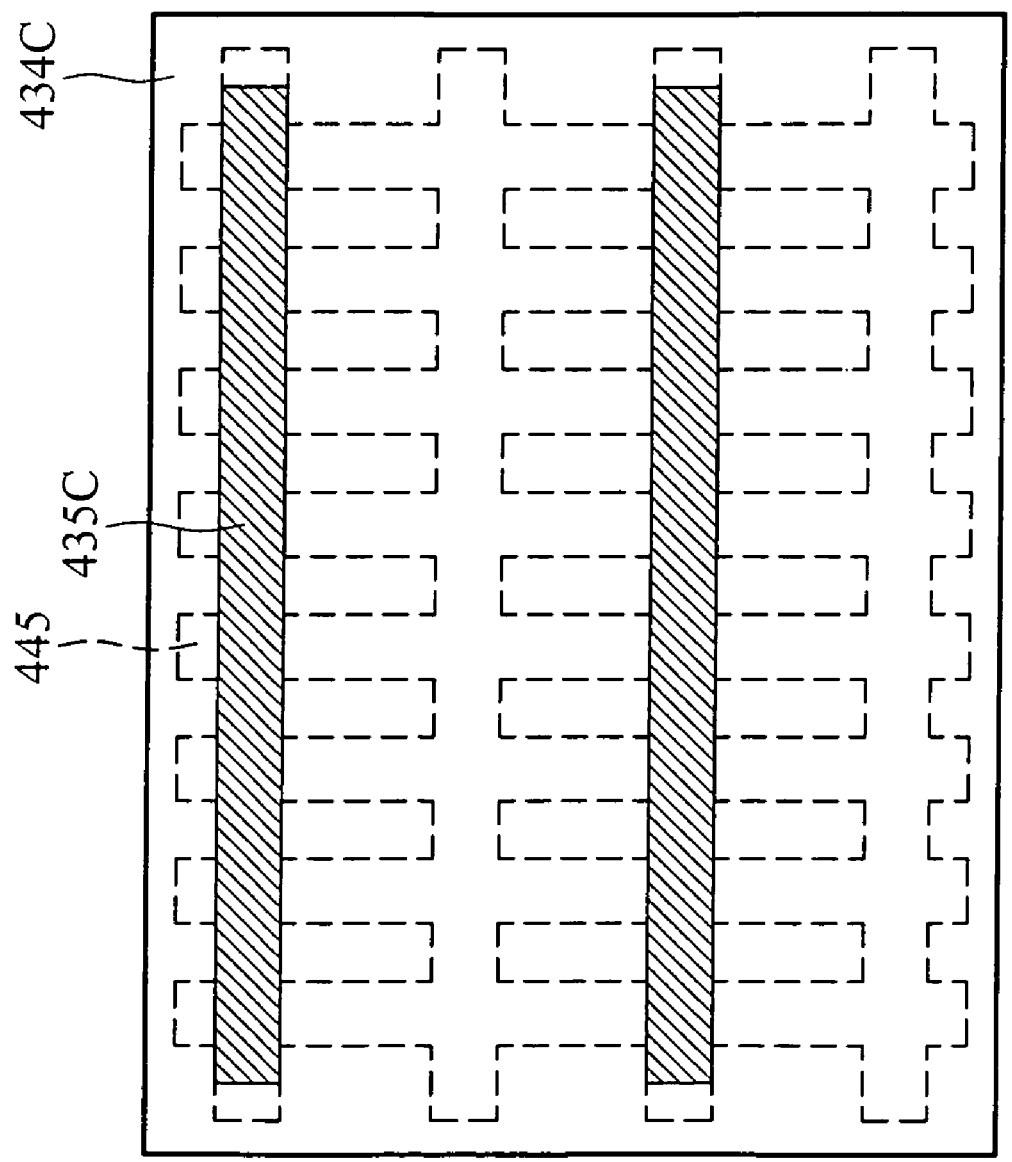
Figure 5E:
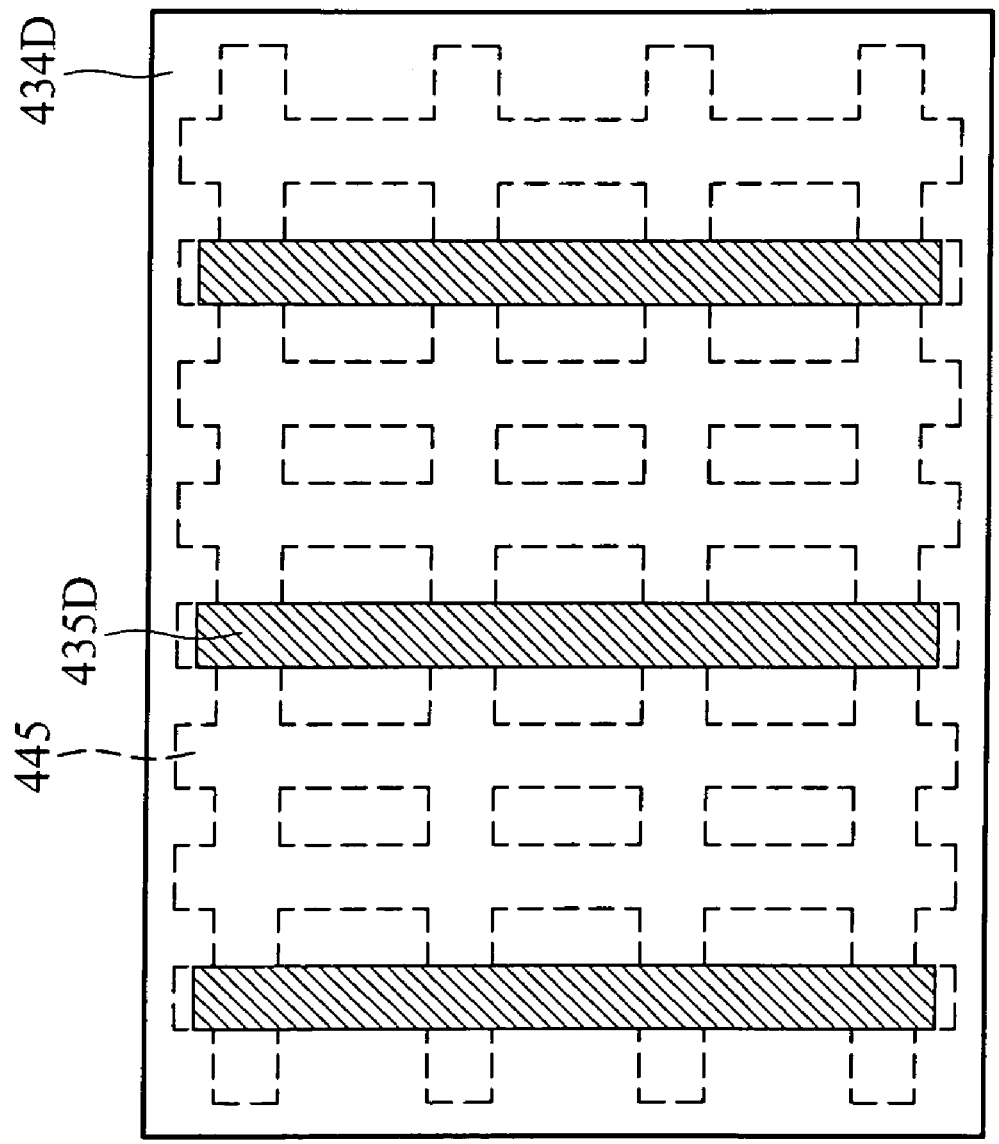

FIG. 5A shows a cross-sectional view of an active region AR of an AM-OLED device in accordance with yet a further embodiment of the present invention. Because both the black matrix layer 445 and the cathode layer 432 are continuative structures, it is not necessary for the conductive component 435 to be formed as a continuative structure or to be formed at every position corresponding to all of the pixels. Thus, the only requirement, is to form openings with any kind of shape at positions corresponding to the black matrix layer 445 in the passivation layer. Then, a conductive material may be filled in to the openings to form conductive components with the same shape of the openings. The openings may be elliptoid openings 435A, elliptoid openings with a longer long axis 435B, transverse rectangular openings 435C, longitude rectangular openings 435D, circular openings, square openings, or slit-like openings, as shown in FIG. 5B-5E.

Figure 6:
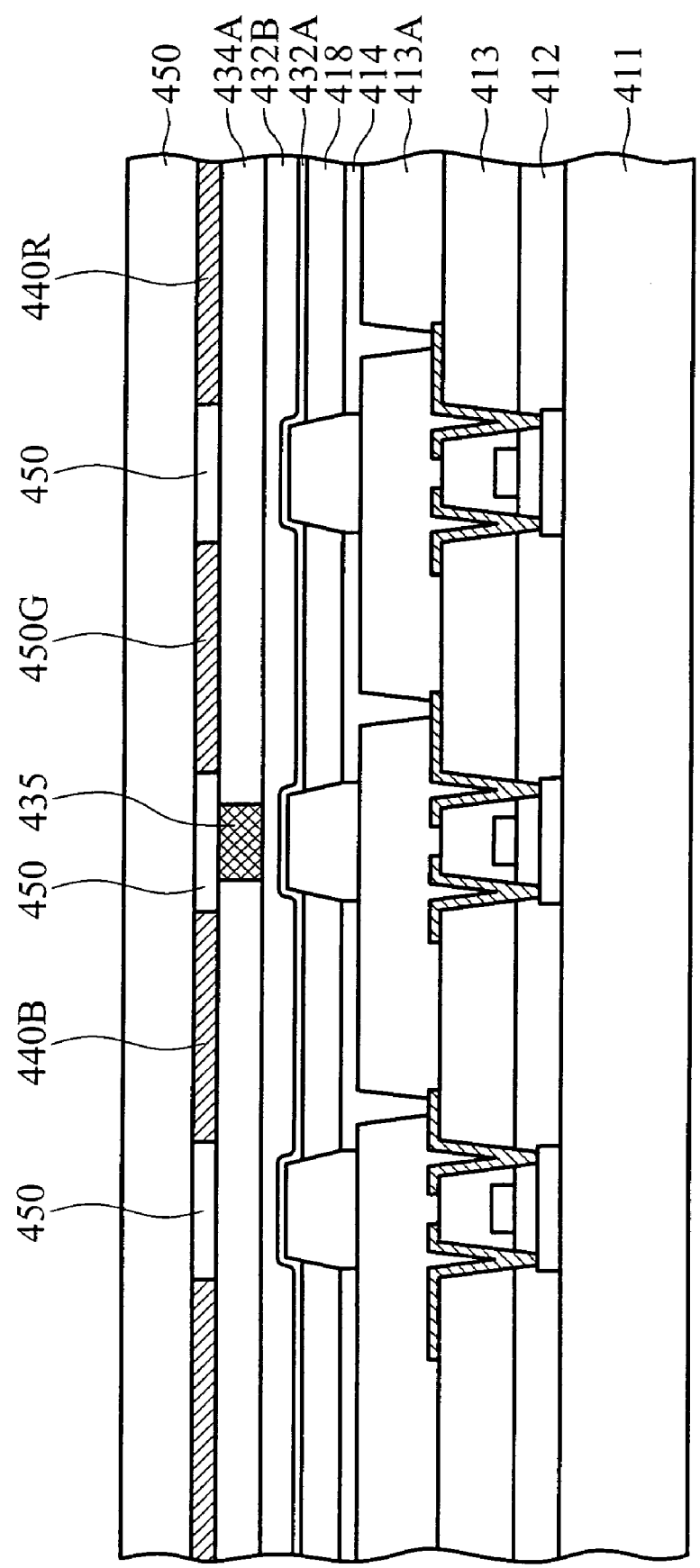
FIG. 6 shows a cross-sectional view of an active region of an AM-OLED device in accordance with one embodiment of the present invention.

FIG. 6 shows a cross-sectional view of an active region of an AM-OLED device in accordance with one embodiment of the present invention. In order to increase the transmittance and the conductivity of the cathode, the cathode of the embodiment is formed as a composite layer structure having a metal layer 432A and a transparent oxide conductive layer 432B, such as an ITO layer or an IZO layer. The metal layer 432A may improve the carrier injection between the organic electroluminescent layer 418 and the cathode. The transparent oxide conductive layer 432B may improve the transmittance and the conductivity of the cathode.

Accordingly, an AM-OLED device in accordance with one embodiment of the present invention may prevent the step coverage problem of the cathode in the prior art. The electrical connection between the cathode and the control circuit in the peripheral region is obviously improved, which further improves the display quality and reliability of the AM-OLED device.

Figure 7:
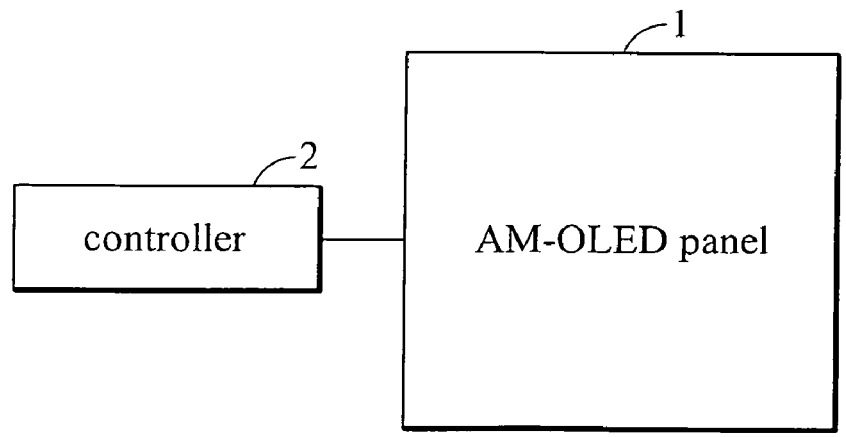
FIG. 7 shows an AM-OLED module 3 comprising an AM-OLED panel 1 in accordance with one embodiment of the present invention.

FIG. 7 shows an AM-OLED module 3 comprising an AM-OLED panel 1 in accordance with one embodiment of the present invention. An AM-OLED panel 1 couples to a controller 2 to form an AM-OED module 3. In FIG. 7, the AM-OLED module 3 comprises an activation circuit of a row controller and a column controller (not shown) for controlling the AM-OLED panel 1. According to the signal input to the AM-OLED panel 1, a desired image may be displayed. The AM-OLED panel 1 comprises an active region AR and a peripheral region PR. A control signal from the controller 2 may be sent to a cathode through a signal line in the peripheral region PR and an upper substrate of the AM-OLED panel 1.

Figure 8:
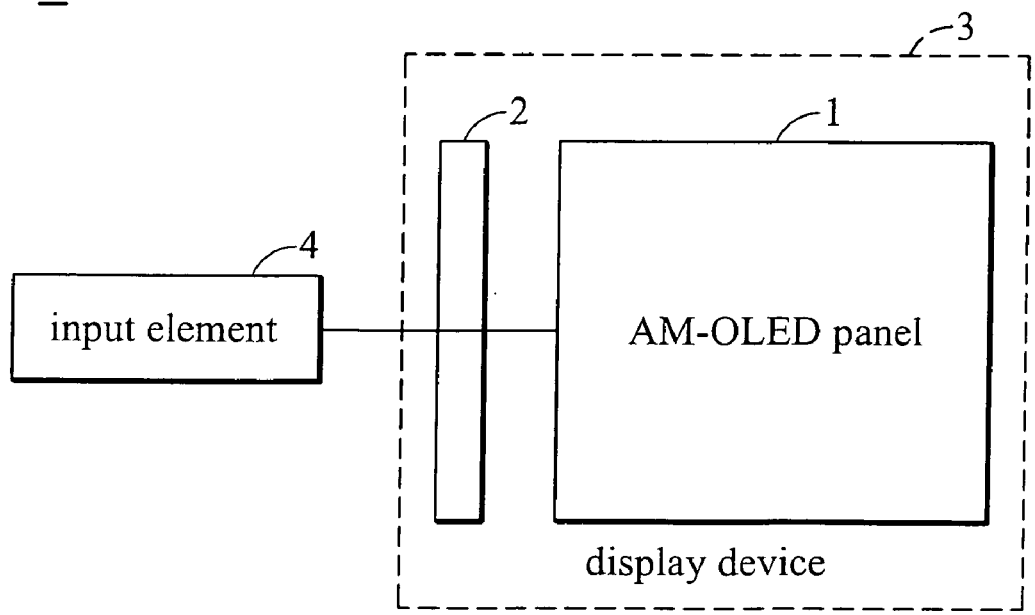
FIG. 8 shows an electronic device comprising the AM-OLED module 3 in accordance with one embodiment of the present invention.

FIG. 8 shows an electronic device comprising the AM-OLED module 3 in accordance with one embodiment of the present invention. An input element 4 couples to the controller 2 of the AM-OLED module 3. The input element 4 comprises a micro processing unit for sending a signal to the controller 2 for image display. The electronic device 5 comprises, for example, a personal digital assistant (PDA), a mobile phone, a portable computer, a digital camera, a personal computer, a television, an automotive display, an avionics display, a global positioning system (GPS), a digital photo frame, or a portable DVD.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic light emitting display device comprising:
    an active matrix substrate comprising an array of active elements disposed in an active region and a control circuit disposed in a peripheral region;
    a color filter substrate oppositely disposed to the active matrix substrate, comprising:
        color filter elements with different colors;
        a black matrix layer enclosing the color filter elements in a region corresponding to the active region; and
        an extension of the black matrix layer in a region corresponding to the peripheral region;
    an array of OLED pixels interposed between the active matrix substrate and the color filter substrate on the active region, wherein each of the OLED pixels comprise an anode, an organic electroluminescent layer, and a cathode;
    a first conductive component electrically connecting the control circuit and the extension of the black matrix layer; and
    a second conductive component electrically connecting the black matrix layer and the cathode.

2. The organic light emitting display device as claimed in claim 1, wherein the control circuit control the cathode of each of the OLED pixels through the first conductive component, the extension of the black matrix layer, the black matrix layer, and the second conductive component.

3. The organic light emitting display device as claimed in claim 1, wherein the organic light emitting display device is a top emitting type active matrix organic light emitting display device.

4. The organic light emitting display device as claimed in claim 1, wherein the cathode is a conductive layer with a single layer structure.

5. The organic light emitting display device as claimed in claim 4, wherein the cathode comprises Ag, Al, Mg, Ca, Na, indium oxide, sin oxide, zinc oxide, ITO, IZO, or combinations thereof.

6. The organic light emitting display device as claimed in claim 1, wherein the cathode is a composite layer comprising a metal layer and a transparent oxide conductive layer.

7. The organic light emitting display device as claimed in claim 1, further comprising a passivation layer between the cathode and the color filter substrate, wherein the passivation layer has a plurality of openings exposing the cathode, and wherein the second conductive component is disposed in the openings.

8. The organic light emitting display device as claimed in claim 7, wherein the second conductive component corresponds to the black matrix layer and electrically connects the cathode.

9. The organic light emitting display device as claimed in claim 7, wherein a shape of the second conductive component is elliptoid, transverse rectangular, longitude rectangular, circular, or square.

10. The organic light emitting display device as claimed in claim 7, further comprising a third conductive component between the passivation layer and the color filter substrate.

11. The organic light emitting display device as claimed in claim 10, wherein the third conductive component is a transparent oxide conductive layer comprising ITO or IZO.

12. The organic light emitting display device as claimed in claim 1, wherein the array of active elements comprises an array composed of thin film transistors and storage capacitors.

13. The organic light emitting display device as claimed in claim 12, wherein the thin film transistor electrically connects the anode of each of the OLED pixels.

14. The organic light emitting display device as claimed in claim 1, wherein the anode comprises Pt, Au, Ag, Cr, W, or combinations thereof.

15. The organic light emitting display device as claimed in claim 1, wherein the black matrix layer and the BM extension is a light absorption layer comprising Cr.

16. An OLED module, comprising:
    an organic light emitting display device as claimed in claim 1; and
    a controller coupled to the organic light emitting display device, for controlling the organic light emitting device to display an image according to an input signal.

17. An electronic device, comprising:
    an OLED module as claimed in claim 16; and
    an input element coupled to the controller to send a signal to the controller for image display.

18. The electronic device as claimed in claim 17, wherein the electronic device comprises a personal digital assistant (PDA), a mobile phone, a portable computer, a digital camera, a personal computer, a television, an automotive display, an avionics display, a global positioning system (GPS), a digital photo frame, or a portable DVD.

19. The organic light emitting display device as claimed in claim 1, wherein the array of OLED pixels and the control circuit are disposed on and supported by the active matrix substrate, and the black matrix layer and the extension of the black matrix layer are disposed on and supported by the color filter substrate.

20. The organic light emitting display device as claimed in claim 19, wherein the array of OLED pixels and the control circuit supported by the active matrix substrate are spaced apart from the black matrix layer and the extension of the black matrix layer supported by the color filter substrate, and wherein the first conductive component is disposed between the extension of the black matrix layer and the control circuit, and wherein the second conductive component is disposed between the black matrix layer and the cathode.

* * * * *